United States Patent
Park et al.

(10) Patent No.: US 10,261,546 B2
(45) Date of Patent: Apr. 16, 2019

(54) DISPLAY DEVICE

(71) Applicant: SAMSUNG DISPLAY CO., LTD., Yongin-si, Gyeonggi-Do (KR)

(72) Inventors: Ik Hyung Park, Yongin-si (KR); Ji Yeon Kim, Yongin-si (KR); Myung Hwan Kim, Yongin-si (KR); Dae Ho Yoon, Yongin-si (KR); Seong Jin Hwang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/828,543

(22) Filed: Dec. 1, 2017

(65) Prior Publication Data
US 2018/0181165 A1    Jun. 28, 2018

(30) Foreign Application Priority Data

Dec. 26, 2016    (KR) ........................ 10-2016-0179453

(51) Int. Cl.
| | | |
|---|---|---|
| *G06F 1/16* | (2006.01) | |
| *C09J 7/38* | (2018.01) | |
| *B32B 37/12* | (2006.01) | |
| *H05K 1/02* | (2006.01) | |

(Continued)

(52) U.S. Cl.
CPC ...... *G06F 1/1652* (2013.01); *B32B 17/10137* (2013.01); *B32B 37/12* (2013.01); *B32B 37/16* (2013.01); *C09J 7/385* (2018.01); *G02F 1/133514* (2013.01); *H01L 27/3272* (2013.01); *H01L 51/0096* (2013.01); *H01L 51/0097* (2013.01); *H01L 51/5284* (2013.01); *H05K 1/028* (2013.01); *B32B 17/064* (2013.01); *B32B 2457/20* (2013.01); *C08K 5/3492* (2013.01);

(Continued)

(58) Field of Classification Search
CPC ............ B32B 17/064; B32B 17/10137; B32B 2457/20; B32B 37/12; B32B 37/16; C08K 5/3492; C09J 133/08; C09J 7/385; G02F 1/133305; G02F 1/133514; G02F 1/133308; G06F 1/1652; H01L 27/3272; H01L 51/0097; H01L 27/12; H01L 51/5246; H01L 51/5253; H01L 51/0096; H01L 51/5284; H04M 1/0268; H05K 1/028; C08B 3/06; C07F 15/0033; C03C 21/002

See application file for complete search history.

(56) References Cited

U.S. PATENT DOCUMENTS

| | | |
|---|---|---|
| 9,045,670 B2 | 6/2015 | Shitara et al. |
| 9,321,677 B2 | 4/2016 | Chang et al. |

(Continued)

FOREIGN PATENT DOCUMENTS

| | | |
|---|---|---|
| JP | 5945393 | 6/2016 |
| JP | 5952013 | 7/2016 |
| KR | 10-1673122 | 11/2016 |

*Primary Examiner* — Richard J Hong
(74) *Attorney, Agent, or Firm* — F. Chau & Associates, LLC

(57) ABSTRACT

A display device, including: a display panel configured to display an image through a frontal surface thereof; and a window substrate disposed on the frontal surface of the display panel. The window substrate includes at least two sheets of base substrates. The display device may also include an ultraviolet blocking layer. The ultraviolet blocking layer may be disposed between the at least two base substrates.

20 Claims, 7 Drawing Sheets

(51) Int. Cl.
  *B32B 17/10* (2006.01)
  *B32B 37/16* (2006.01)
  *H01L 27/32* (2006.01)
  *H01L 51/00* (2006.01)
  *G02F 1/1335* (2006.01)
  *H01L 51/52* (2006.01)
  *C09J 133/08* (2006.01)
  *C08K 5/3492* (2006.01)
  *B32B 17/06* (2006.01)
  *G02F 1/1333* (2006.01)
  *H04M 1/02* (2006.01)

(52) U.S. Cl.
  CPC ....... *C09J 133/08* (2013.01); *G02F 1/133305* (2013.01); *H04M 1/0268* (2013.01)

(56) References Cited

U.S. PATENT DOCUMENTS

| | | |
|---|---|---|
| 9,321,678 B2 | 4/2016 | Chang et al. |
| 9,321,679 B2 | 4/2016 | Chang et al. |
| 9,557,773 B2 | 1/2017 | Chang et al. |
| 2006/0045992 A1* | 3/2006 | Michihata ................. C08B 3/06 428/1.31 |
| 2009/0021157 A1* | 1/2009 | Kim ..................... H01L 51/5284 313/504 |
| 2013/0038206 A1* | 2/2013 | Aurongzeb ......... H01L 51/5253 313/512 |
| 2013/0114219 A1* | 5/2013 | Garner ............. G02F 1/133308 361/750 |
| 2015/0187953 A1* | 7/2015 | Koezuka ............. H01L 29/7869 257/43 |
| 2015/0210588 A1* | 7/2015 | Chang .................. C03C 21/002 361/750 |
| 2016/0093827 A1* | 3/2016 | Han .................... H01L 51/5246 257/40 |
| 2016/0190222 A1* | 6/2016 | Chen ...................... H01L 27/12 257/40 |
| 2017/0173923 A1* | 6/2017 | Davis ...................... B32B 5/024 |
| 2017/0207249 A1* | 7/2017 | Rhee ................... H01L 27/3211 |
| 2017/0288155 A1* | 10/2017 | Kurihara ............... C07F 15/0033 |
| 2017/0320295 A1* | 11/2017 | Fukuda ..................... B32B 9/04 |
| 2018/0154615 A1* | 6/2018 | Dohn ............... B32B 17/10266 |

* cited by examiner

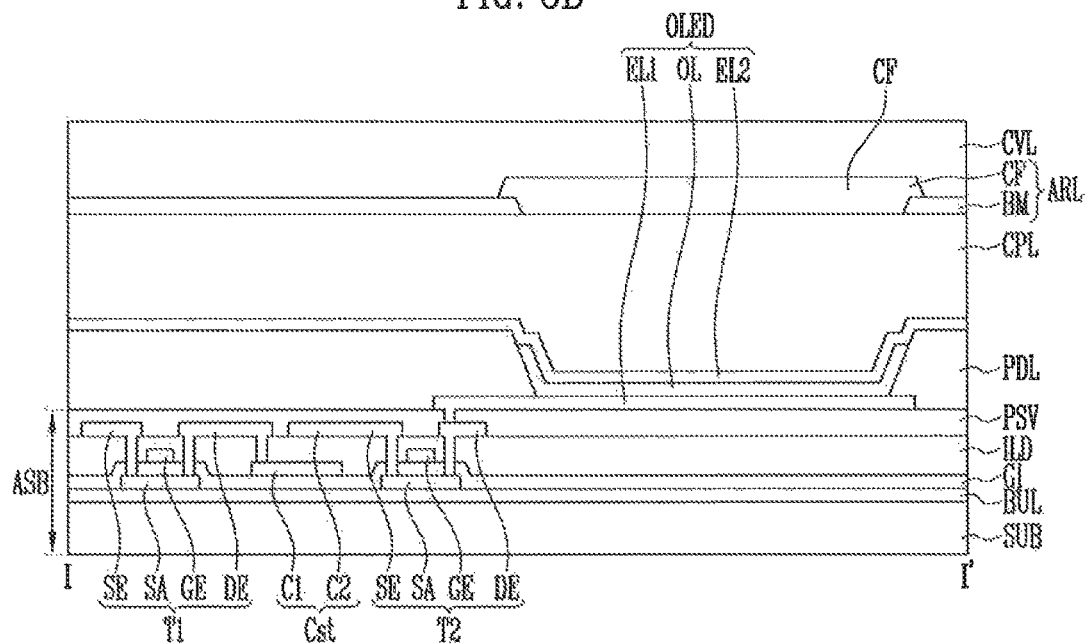
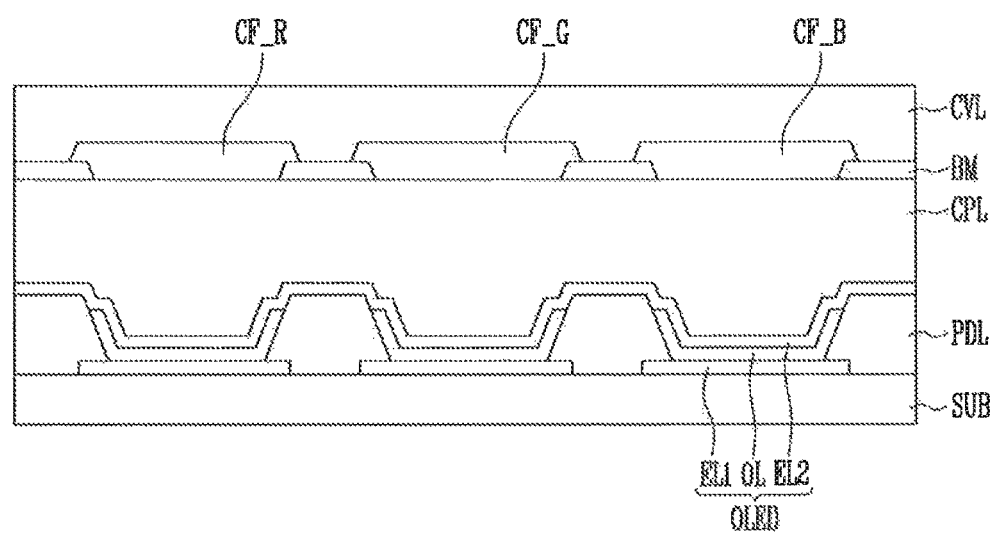

DISPLAY DEVICE

CROSS-REFERENCE TO RELATED APPLICATION

This application claims priority under 35 U.S.C. § 119 to Korean Patent Application No. 10-2016-0179453, filed on Dec. 26, 2016 in the Korean Intellectual Property Office, the disclosure of which is incorporated by reference herein in its entirety.

TECHNICAL FIELD

Exemplary embodiments of the present invention relate to a display device.

DISCUSSION OF RELATED ART

An organic light-emissive display device is a self-emitting display device. The organic light-emissive display device may have a relatively wide viewing angle, a relatively high contrast, and a relatively high response rate, for example, when compared to a non-emissive display device.

The organic light-emitting display device may include a plurality of metal patterns or metal layers. The organic light-emitting display device may reflect external light. A polarizing plate may be included in the organic light-emissive display device to reduce or prevent the reflection of external light.

The polarizing plate may include a polarizer and a phase retard plate. The polarizing plate may reduce or prevent the reflection of external light. However, degradation of transmittance of light emitted from an internal side of the organic light-emitting display device may occur.

SUMMARY

An exemplary embodiment of the present disclosure provides a display device. The display device includes a display panel, a window substrate, and an ultraviolet blocking layer. The display panel is configured to display an image through an upper surface thereof. The window substrate is disposed on the upper surface of the display panel. The window substrate includes at least two sheets of base substrates. The ultraviolet blocking layer is disposed between the at least two base substrates.

The ultraviolet blocking layer may have transmissivity of about 10% or less in a wavelength band of less than about 350 nm.

The ultraviolet blocking layer may have transmissivity of about 1% or less in a wavelength band of less than about 400 nm.

The at least two base substrates may include a first glass substrate having a first thickness and a second glass substrate having a second thickness. Each of the first thickness and the second thickness may be about 20 μm to about 100 μm. A thickness of the ultraviolet blocking layer may be about 10 μm to about 100 μm.

When the window substrate is bent so that the first glass substrate is disposed at an external side of the display device and the second glass substrate is disposed at an internal side of the display device, the first thickness may be smaller than the second thickness.

The thickness of the ultraviolet blocking layer is about 10 μm to about 100 μm.

The ultraviolet blocking layer may include an optically transparent adhesive.

The number of base substrates may be at least three.

The display panel may include: an array substrate; an organic light-emitting diode disposed on the array substrate; and an anti-reflection layer disposed on the organic light-emitting diode.

The anti-reflection layer may include a color filter and a black matrix.

The organic light-emitting diode may include: a first electrode disposed on the array substrate; an organic emitting layer disposed on the first electrode; and a second electrode disposed on the organic emitting layer.

The second electrode may include a semi-transmissive reflective layer in an area corresponding to the organic emitting layer. The second electrode may include a reflective layer in other areas.

The second electrode may have different thicknesses in the area corresponding to the organic emitting layer and the other areas.

At least one of the base substrates may be chemically tempered.

The window substrate may have an impact resistance characteristic such that the window substrate is not damaged when a pen of about 5.8 g is vertically fallen onto one surface of the window substrate at a first height, and the first height may be about 7 cm or more.

At least a part of the window substrate and the display panel may be flexible.

The display device may further include a buffer layer. The buffer layer may be disposed on a rear surface of the display panel. The buffer layer may be configured to absorb impact applied to the window substrate and the display panel.

The display device may further include a support member. The support member may be disposed between the display panel and the buffer layer.

The support member may include a metal.

The display device may further include an adhesive layer. The adhesive layer may be disposed between the window substrate and the display panel.

BRIEF DESCRIPTION OF THE DRAWINGS

These and/or other aspects will become apparent and more readily appreciated from the following description of the exemplary embodiments, taken in conjunction with the accompanying drawings, in which:

FIG. 3B is a cross-sectional view taken along a line I-I' of FIG. 3A according to an exemplary embodiment of the present invention;

FIG. 4 is a cross-sectional view illustrating a display device including three pixels according to an exemplary embodiment of the present invention;

DETAILED DESCRIPTION OF THE EMBODIMENTS

Figure 1:
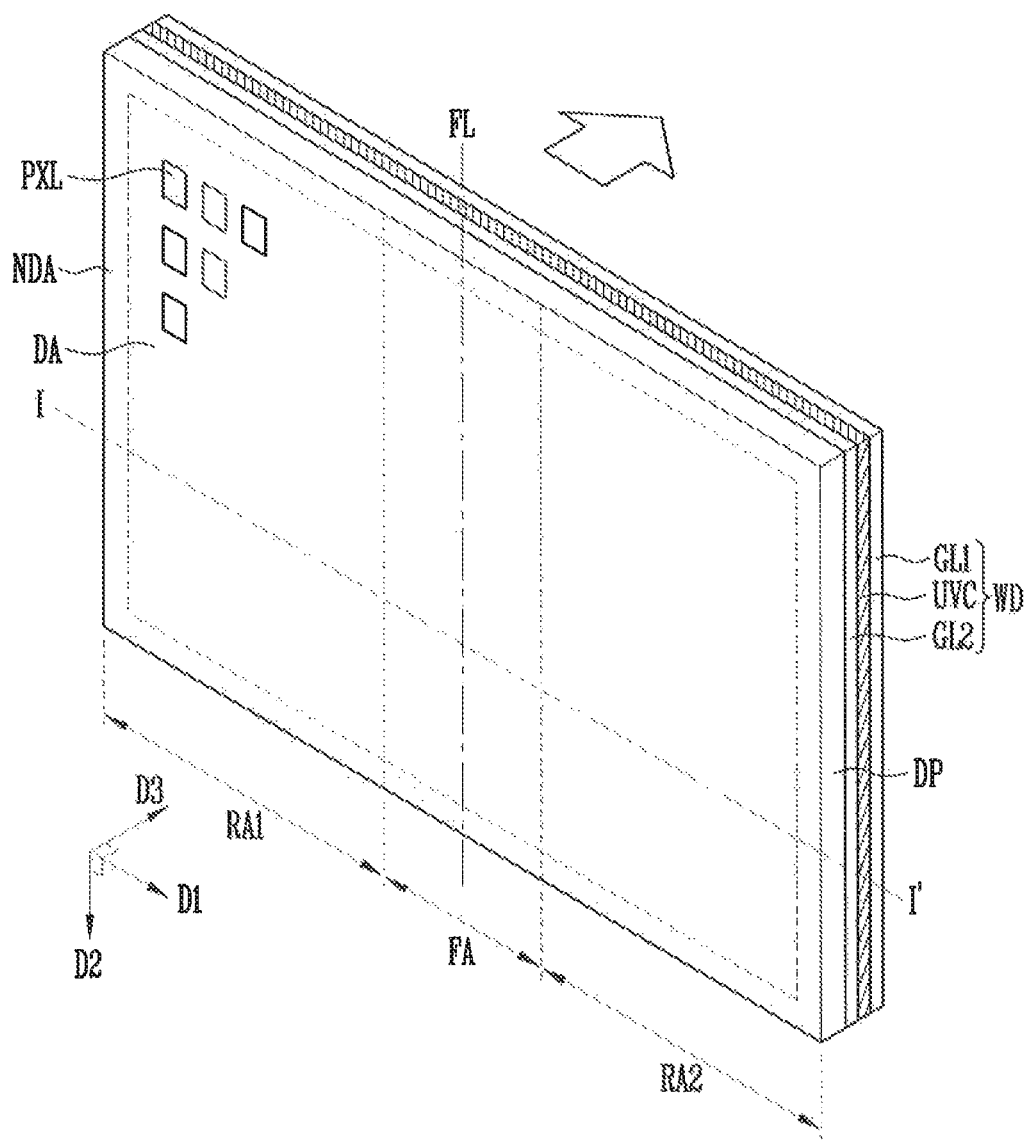
FIG. 1 is a perspective view illustrating a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

Hereinafter, exemplary embodiments of the present invention will be described in detail with reference to the accompanying drawings.

Figure 2A:
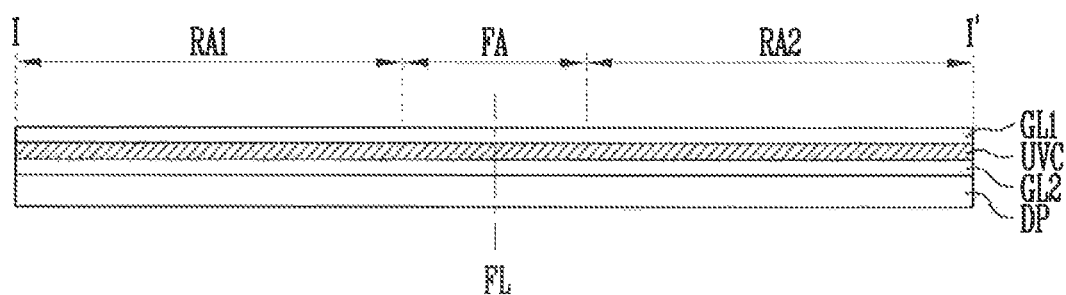
FIG. 2A is a cross-sectional view taken along a line I-I' of FIG. 1 according to an exemplary embodiment of the present invention.
Figure 2B:
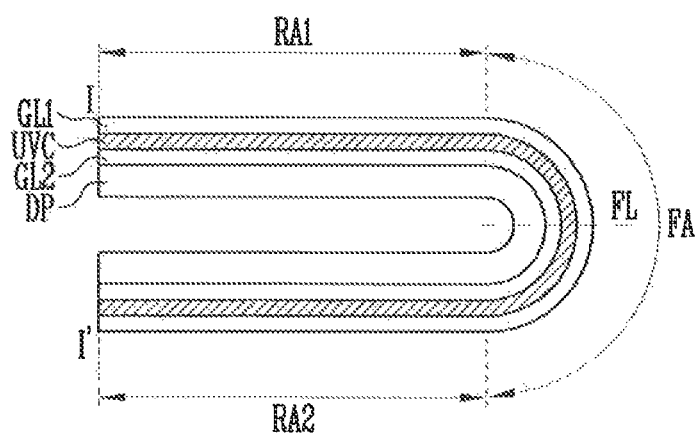
FIG. 2B is a cross-sectional view of a folded display device of FIG. 1 according to an exemplary embodiment of the present invention.

FIG. 1 is a perspective view illustrating a display device according to an exemplary embodiment of the present invention. FIG. 2A is a cross-sectional view taken along a line I-I' of FIG. 1 according to an exemplary embodiment of the present invention. FIG. 2B is a cross-sectional view of a folded display device of FIG. 1 according to an exemplary embodiment of the present invention.

Referring to FIGS. 1, 2A, and 2B, the display device may be a foldable display device or a bendable display device.

The display device may have various shapes, for example, the display device may have a rectangular plate shape having two pairs of substantially parallel sides. When the display device has a rectangular plate shape, sides of any one pair between the two pairs of sides may be provided to be longer than the sides of another pair. An exemplary embodiment of the present invention described herein may include the display device having a rectangular shape. An extension direction of a relatively long side of the rectangular shape may be a first direction D1. An extension direction of a relatively short side of the rectangular shape may be a second direction D2. A direction substantially vertical to the extension directions of the relatively long side and the relatively short side of the rectangular shape may be a third direction D3.

However, the shape of the display device is not limited thereto, and the display device may have various shapes. For example, the display device may be provided in various shapes, such as a polygon having a closed shape including a substantially straight side, a circle and an ellipse including a curved side, and a semicircle and a half ellipse including a side formed of a straight line and a curved line. According to an exemplary embodiment of the present invention, when the display device has a substantially straight side, at least a portion of the corners having a conic shape may have a curved line. For example, when the display device has a rectangular shape, a portion, in which the adjacent substantially straight sides meet, may be replaced with a curve line having a predetermined curvature. That is, in a vertex portion of the rectangular shape, both adjacent ends may be connected to two adjacent substantially straight sides and be formed of curve sides having a predetermined curvature. The curvature may be differently set according to a position, for example, a start position of the curve line, a length of the curve line, and the like.

At least a portion of the display device may have flexibility. The display device may be folded in the portion having flexibility. The display device may include a foldable area and a relatively rigid area. The foldable area may have flexibility and may be foldable. The foldable area may have flexibility and may be foldable provided at least one side of the foldable area and is in an unfolded state.

The non-folded area may be referred to as the rigid area. The term "rigid" may include an area having flexibility, but with less flexibility than a flexibility of the foldable area. The term "rigid" may also refer to an area having flexibility, but is unfolded. The term "rigid" may also refer to an area that has substantially no flexibility and is relatively rigid.

According to an exemplary embodiment of the present invention, an entirety of the display device may correspond to the foldable area. For example, when the display device completely rolled, an entirety of the display device may correspond to the foldable area.

According to an exemplary embodiment of the present invention, a first rigid area RA1, a foldable area FA, and a second rigid area RA2 may be sequentially disposed in the first direction D1. The foldable area FA may extend in the second direction D2.

The display device may be folded along a center line, which may be referred to as a folding line FL; however, exemplary embodiments of the present invention are not limited thereto. The number of folding lines FL may be two or more. The folding lines FL may be disposed within the foldable area FA. According to an exemplary embodiment of the present invention, the folding line FL may pass through the center of the foldable area FA. The foldable area FA may be axisymmetric, for example, based on the folding line FL is disclosed; however, exemplary embodiments of the present invention are not limited thereto. For example, the folding line FL may be asymmetrically provided within the foldable area FA. The foldable area FA and the folding line FL disposed in the foldable area FA may overlap an area of a display panel DP. The display panel DP may display an image. When the display device is folded, a portion of the display device displaying an image may be folded.

The term "folded" may refer to that a form is not fixed, but is transformable, for example from an original form to another form. The term "folded" may include when the display device is folded, curved, or rolled in a scroll-type method along one or more specific lines (e.g., the folding line FL). According to an exemplary embodiment of the present invention, one surface of the two rigid areas may be substantially parallel to each other, and may be folded to face each other; however, exemplary embodiments of the present disclosure are not limited thereto. For example, the surfaces of the two rigid areas may be folded by a predetermined angle (e.g., an acute angle, a right angle, or an obtuse angle) with the foldable area disposed therebetween.

In the display device according to an exemplary embodiment of the present invention, the folding line FL may be provided within the foldable area FA, for example, in the second direction. The second direction may be the extension direction of the foldable area FA.

According to an exemplary embodiment of the present invention, the first and second rigid areas RA1 and RA2 may have similar areas, and the foldable area FA may be positioned between the two rigid areas; however, exemplary embodiments of the present invention are not limited thereto. For example, the first and second rigid areas RA1 and RA2 may have different areas. Further, the number of rigid areas provided might not be two, and at least one rigid area may be provided. The plurality of rigid areas may be spaced apart from each other with the foldable area FA disposed therebetween.

The display device according to an exemplary embodiment of the present invention may include the display panel DP, and a window substrate WD. The display panel DP may display an image. The window substrate WD may be disposed on a surface of the display panel DP.

The display panel DP may display predetermined visual information, for example, a text message, a video, a picture, and a 2-D or 3-D image. The type of display panel DP is not limited, thus, any display panel displaying an image may be provided.

The display panel DP may be provided in a plate shape including two surfaces. According to an exemplary embodiment of the present invention, the display panel DP may display an image, for example, through at least one surface thereof. The at least one surface may be disposed between a front surface and a rear surface of the display panel. The display panel DP displaying an image through the front surface thereof will be described in more detail below.

The display panel DP may include a display area DA and a non-display area NDA. An image may be displayed in the display area. The non-display area NDA may be disposed on at least one side of the display area DA. For example, the non-display area NDA may surround the display area DA.

The display area DA may be an area in which the plurality of pixels PXL are disposed, for example, to display an image.

The display area DA may be provided in a shape corresponding to a shape of the display device. For example, the display area DA may be provided in various shapes, such as a polygon having a closed shape including a substantially straight side, a circle and an ellipse including a curved side, and a semicircle and a half ellipse including a side formed of a substantially straight line and a curved line, similar to the shape of the display device. According to an exemplary embodiment of the present invention, the display area DA may have a rectangular shape.

The pixels PXL may be disposed on the display area DA. Each pixel PXL may be a minimum unit displaying an image. The plurality of pixels PXL may be provided. The pixels PXL may emit white light and/or colored light. Each pixel PXL may emit any one of red light, green light, and blue light; however, exemplary embodiments of the present invention are not limited thereto. Thus, each pixel PXL may emit a color, such as cyan, magenta, and yellow.

The plurality of pixels PXL may be organic light-emitting devices including organic light-emitting layers; however, exemplary embodiments of the present invention are not limited thereto. The plurality of pixels PXL may be implemented in various forms, such as liquid crystal devices, electrophoretic devices, and electrowetting devices.

The display panel including the pixels PXL will be described in more detail below.

The window substrate WD may be disposed on a first surface of the display panel DP. The first surface of the display panel DP may be a front surface of the display panel. The window substrate WD may allow an image to pass through the display panel DP, block ultraviolet rays, and relieve external impact. Thus, the window substrate WD may reduce or prevent the display panel DP from being damaged or erroneously operated. The external impact may refer to power from the outside expressible as pressure and stress, and may refer to power causing a defect to the display panel DP.

The window substrate WD may block ultraviolet rays, for example, to prevent a constituent element (e.g., the organic light-emitting device) included in the display panel DP from being damaged. The blocking of the ultraviolet rays of the window substrate WD will be described in more detail below.

The window substrate WD may have relative elasticity. Thus, the window substrate WD may absorb external impact and substantially simultaneously disperse the external impact to an adjacent area as described above. For example, the window substrate WD may have an elastic force. The window substrate WD may be transformed by impact from the outside, for example, due to the elastic force. The window substrate may be restorable to an original state when pressure from the outside is removed. Further, the window substrate WD may have a relatively high impact resistance characteristic. Thus, the window substrate WD may be less transformed or damaged by an external impact.

The window substrate WD may relieve a bending deformation of the display panel DP, for example, by point impact, surface impact, and compressive strain and/or tensile strain of the display panel DP by, for example, a surface impact to the display panel. Thus, a defect of the display panel may be reduced or prevented.

The entirety or at least a part of the window substrate WD may have flexibility. For example, the entirety or at least a partial area of the window substrate WD may have flexibility.

According to an exemplary embodiment of the present invention, the display panel DP and the window substrate WD may have substantially the same shape.

The window substrate WD may include at least two sheets of base substrates, and an ultraviolet blocking layer UVC. The ultraviolet blocking layer UVC may be disposed between the adjacent base substrates.

The base substrates may include glass, quartz, a polymer organic material, and the like. The polymer organic material may include one of polyethersulfone (PES), polyacrylate, polyetherimide (PEI), polyethyelenen naphthalate (PEN), polyethylene terephthalate (PET), polyphenylene sulfide (PPS), polyarylate (PAR), polyimide (PI), Polycarbonate (PC), Triacetate Cellulose (TAC), or cellulose acetate propionate (CAP). Further, the substrate SUB may also include Fiber glass Reinforced Plastic (FRP). According to an exemplary embodiment of the present invention, the base substrates may be provided with two glass substrates, for example, a first glass substrate GL1 and a second glass substrate GL2.

According to an exemplary embodiment of the present invention, the base substrates may include the first glass substrate GL1 and the second glass substrate GL2. The ultraviolet blocking layer UVC may be disposed between the first glass substrate GL1 and the second glass substrate GL2.

The display panel DP may be provided on the first glass substrate GL or the second glass substrate GL2 of the window substrate WD. The display panel DP may be provided on the second glass substrate GL2. The display panel DP may be disposed in a form in which an external surface of the second glass substrate GL2 is in contact with the first surface of the display panel DP. However, the position of the window substrate WD and the display panel DP is not limited thereto. The display panel DP may be provided on the first glass substrate GL2. The display panel DP may be disposed in a form in which an external surface of the first glass substrate GL1 is in contact with the first surface of the display panel DP.

An optically transparent adhesive layer may be provided between the display panel DP and the window substrate WD. Herein, the adhesive layer may be a bonding agent and/or an adhesive.

According to an exemplary embodiment of the present invention, the window substrate WD may have different thicknesses, different repulsive force, and different impact resistance characteristics in the folding area FA and the rigid areas RA1 and RA2. Although the window substrate WD may be flexible, when the window substrate WD is bent more than once in a specific area (e.g., the foldable area FA), a stress applied to the specific area may be larger than a stress applied to remaining areas of the window substrate WD. Thus, since the window substrate WD according to an exemplary embodiment of the present invention may have different thicknesses, different repulsive force, and different impact resistance characteristics in the specific area (e.g., the folding area FA) and the remaining areas (e.g., the rigid areas RA1 and RA2) of the window substrate WD, damage to the window substrate WD, for example, by stress produced by repeatedly bending the window substrate WD, may be reduced or prevented.

For example, each index in the foldable area FA of the window substrate WD may be differently set by a method of differentiating thicknesses of the first and/or second glass substrates GL and GL2 or a method of differentiating chemical strengthening depth.

According to an exemplary embodiment of the present invention, each of the first glass substrate GL1 and the second glass substrate GL2 may be provided in a plate shape having two surfaces. Each of the first glass substrate GL1 and the second glass substrate GL2 may include a glass material. The glass material may include silicate. The glass material may additionally include various materials. Thus, durability, surface smoothness, and transparency of the first glass substrate GL1 and the second glass substrate GL2 are relatively high. For example, the first glass substrate GL1 and the second glass substrate GL2 may include aluminosilicate, borosilicate, boroaluminosilicate, or the like. The first glass substrate GL1 and the second glass substrate GL2 may further include an alkali metal, an alkali earth metal, and an oxide thereof, or the like.

According to an exemplary embodiment of the present invention, the materials of the first and second glass substrates GL and GL2 are not limited to the disclosed contents. The first and second glass substrates GL and GL2 may include other various materials and in various ratios.

The ultraviolet blocking layer UVC may block ultraviolet rays from the outside, for example, to protect the display panel DP. The ultraviolet blocking layer UVC may attach the first glass substrate GL1 and the second glass substrate GL2 to each other. The ultraviolet blocking layer UVC may include a material blocking ultraviolet rays, and a material bonding the first glass substrate GL1 and the second glass substrate GL2. The material blocking ultraviolet rays and the material bonding the first glass substrate GL1 and the second glass substrate GL2 may be provided in a mixed form.

Examples of the material blocking ultraviolet rays may include a benzotriazol-based ultraviolet ray absorbent, a triazine-based ultraviolet ray absorbent, a benzophenone-based ultraviolet ray absorbent, a benzoate-based ultraviolet ray absorbent, or the like. The material blocking ultraviolet rays may include inorganic ultrafine particles, such as a zinc oxide or a titan oxide. These materials may be used separately or in combination with each other.

The material bonding the first glass substrate GL1 and the second glass substrate GL2 may be optically transparent. The material bonding the first glass substrate GL1 and the second glass substrate GL2 may include an acrylic polymer, ethylene vinyl acetate polymer, nitrile polymer, silicon rubber, butyl rubber, styrene block copolymer, vinyl ether polymer, urethane polymer, epoxy polymer, or the like may be used. For example, the ultraviolet blocking layer UVC may include urethane polymer, or a material, in which rubber or acrylic polymer is added to urethane polymer. However, the material exhibiting the adhesive of the ultraviolet blocking layer UVC is not limited thereto.

The ultraviolet blocking layer UVC may block light in a wavelength band having a shorter wavelength than a wavelength of visible rays by the material blocking ultraviolet rays. The ultraviolet blocking layer UVC may block light in an ultraviolet wavelength band. According to an exemplary embodiment of the present invention, the ultraviolet blocking layer UVC may block light by about 90% or more in a wavelength band of less than about 350 nm. Thus, the ultraviolet blocking layer UVC may have a transmissivity of about 10% or less. According to an exemplary embodiment of the present invention, the ultraviolet blocking layer UVC may block light by about 99% or more in a wavelength band of less than about 400 nm. Thus, the ultraviolet blocking layer UVC may have a transmissivity of about 1% or less.

The ultraviolet blocking layer UVC may block ultraviolet rays from the outside moving toward the display panel DP. Thus, the ultraviolet blocking layer UVC may prevent ultraviolet rays from influencing on the device (e.g., the organic light-emitting device) included in the display panel DP. The ultraviolet blocking layer UVC may permit substantially all of the light (e.g., visible rays) other than ultraviolet rays. Thus, the ultraviolet blocking layer UVC may substantially simultaneously increase a transmissivity and visibility of an image emitted from the display panel DP.

According to an exemplary embodiment of the present invention, the ultraviolet blocking layer UVC may include the adhesive. Thus, a stress generated in the first glass substrate GL1 and the second glass substrate GL2 may be dispersed. When an impact is applied to a part of the first glass substrate GL1 and/or the second glass substrate GL2, the ultraviolet blocking layer UVC may offset a tensile strength generated in the first glass substrate GL1 and/or the second glass substrate GL2 by the impact. Thus, the ultraviolet blocking layer UVC may prevent the first glass substrate GL1 and/or the second glass substrate GL2 from being broken. The ultraviolet blocking layer UVC may absorb impact energy generated when the first glass substrate GL1 and/or the second glass substrate GL2 is broken. Thus, the ultraviolet blocking layer UVC may reduce or prevent scattering of the broken first glass substrate GL1 and/or the second glass substrate GL2. The ultraviolet blocking layer UVC may include an elastic material, for example, to absorb impact energy. The ultraviolet blocking layer UVC may include a flexible material, for example, to be bendable or foldable.

According to an exemplary embodiment of the present invention, an entire thickness of the first glass substrate GL1, the second glass substrate GL2, and the ultraviolet blocking layer UVC may be about 300 µm or less. A distance between both surfaces of the first glass substrate GL1 may be a first thickness. A distance between both surfaces of the second glass substrate GL2 may be a second thickness. A thickness of the ultraviolet blocking layer UVC disposed between the first glass substrate GL1 and the second glass substrate GL2 may be a third thickness. A sum of the first thickness to the third thickness may be about 300 µm or less. When the window substrate WD has a thickness greater than 300 µm, a repulsive force against the transformation is increased. Thus, a bending of the window substrate WD may be relatively difficult.

According to an exemplary embodiment of the present invention, the first thickness of the first glass substrate GL1 may be about 20 µm to about 100 µm. The second thickness of the second glass substrate GL2 may be about 20 µm to about 100 µm. The third thickness of the ultraviolet blocking layer UVC may be about 10 µm to about 100 µm. Alternatively, the first thickness may be about 30 µm to about 50 µm. The second thickness may be about 30 µm to about 50 µm. The third thickness of the ultraviolet blocking layer UVC may be about 10 µm to about 30 µm.

Thus, the window substrate WD may be bendable with a relatively small curvature radius R. Accordingly, the window substrate WD may have a curvature radius R of about 1 mm to about 10 mm or about 1 mm to about 5 mm.

According to an exemplary embodiment of the present invention, the thicknesses of the first glass substrate GL1 and the second glass substrate GL2 may be substantially the same as each other. The thicknesses of the first glass substrate GL2 and the second glass substrate GL2 may be different from each other. When the window substrate WD is folded so that based on any one surface, a part of the one surface faces the remaining part, in order to minimize stress applied to the first and second glass substrates GL and GL2, the thickness of the first glass substrate GL1 and the second glass substrate GL2 may be different.

For example, a reference line, along which the window substrate WD is folded, may be a folding line FL. The folding line FL may be positioned in the second glass substrate GL2 of the window substrate WD. The window substrate WD may be folded so that a part of the surface of the second glass substrate GL2 faces the remaining part of the surface of the second glass substrate GL2 based on the folding line FL. The first glass substrate GL may be disposed at an external side of the window substrate WD. The second glass substrate GL2 may be disposed at an internal side of the window substrate WD. One surface of the first glass substrate GL1 may be an outer circumferential surface. One surface of the second glass substrate GL2 may be an inner circumferential surface. During a bending of the window substrate WD, the first thickness of the first glass substrate GL1 disposed at the external side of the window substrate WD may be smaller than the second thickness of the second glass substrate GL2 disposed at the internal side of the window substrate WD. According to an exemplary embodiment of the present invention, the first thickness may be about 20 µm to about 40 µm. The second thickness may be about 30 µm to about 50 µm.

When an object having a relatively small cross sectional area (e.g., a pen) contacts the window substrate of a comparative example, stress may be applied to the window substrate such that the window substrate bends and subsequently breaks. An impact resistance characteristic of the glass substrate may be increased. Thus, an occurrence of breaking the window substrate may be decreased. The first glass substrate GL1 and the second glass substrate GL2 according to an exemplary embodiment of the present invention may be chemically tempered glass, for example, by an ion exchange process. Thus, an impact resistance characteristic of the window substrate WD may be increased. The term "ion exchange process" may refer to that glass exchanges a positive ion having substantially the same atomic value with a positive ion positioned on a surface of the glass or a neighboring area of the surface of the glass. For example, the "ion exchange process" may refer to a positive ion (e.g., an alkali metal positive ion, such as Na+ and Li+) inside glass is exchanged to another positive ion (e.g., a positive ion, such as K+) from the outside. The ion exchange process may be used for providing a compressive stress profile extended from both surfaces of the glass to a specific depth. When a compressive stress is provided to the first glass substrate GL1 and the second glass substrate GL2, as long as a flaw exists within an area formed of a reference line, in which compressive stress is 0, a relatively high strength against the bending may be provided.

According to an exemplary embodiment of the present invention, the chemical tempering of the two surfaces of the first glass substrate GL1 and the second glass substrate GL2 may be substantially symmetrically performed; however, exemplary embodiments of the present invention not limited thereto. For example, the chemical tempering of the two surfaces of the first glass substrate GL1 and the second glass substrate GL2 may be asymmetrically performed. Particularly, when the first or second glass substrate GL1 and GL2 is folded in a specific direction, the chemical tempering for compensating for the folding in the specific direction this may be asymmetrically performed.

According to an exemplary embodiment of the present invention, the chemical tempering may be performed on the first and second glass substrates GL1 and GL2 of the window substrate WD with substantially the same level or different levels. For example, the first glass substrate GL1 and the second glass substrate GL2 may be chemically tempered so as to have compressive stress having substantially the same level; however, exemplary embodiments of the present invention are not limited thereto. For example, the first glass substrate GL1 and the second glass substrate GL2 may be chemically tempered to have a compressive stress having different levels. The second glass substrate GL2 may be chemically tempered so as to have larger compressive stress than a compressive stress of the first glass substrate GL2. Thus, the second glass substrate GL2 may have a larger depth than a depth of the first glass substrate GL1.

The surface having a flaw to which a tensile stress is applied, when the first glass substrate GL1 and the second glass substrate GL2 is folded or rolled, damage may be minimized. The first glass substrate GL1 and the second glass substrate GL2 may be substantially thin substrates. According to an exemplary embodiment of the present invention, the generation or the growth of a flaw by tensile stress may be decreased when the first glass substrate GL1 and the second glass substrate GL2 are folded or rolled. Thus, damage to the window substrate WD may be decreased.

The display panel DP will be described including one pixel in more detail below.

Figure 3A:
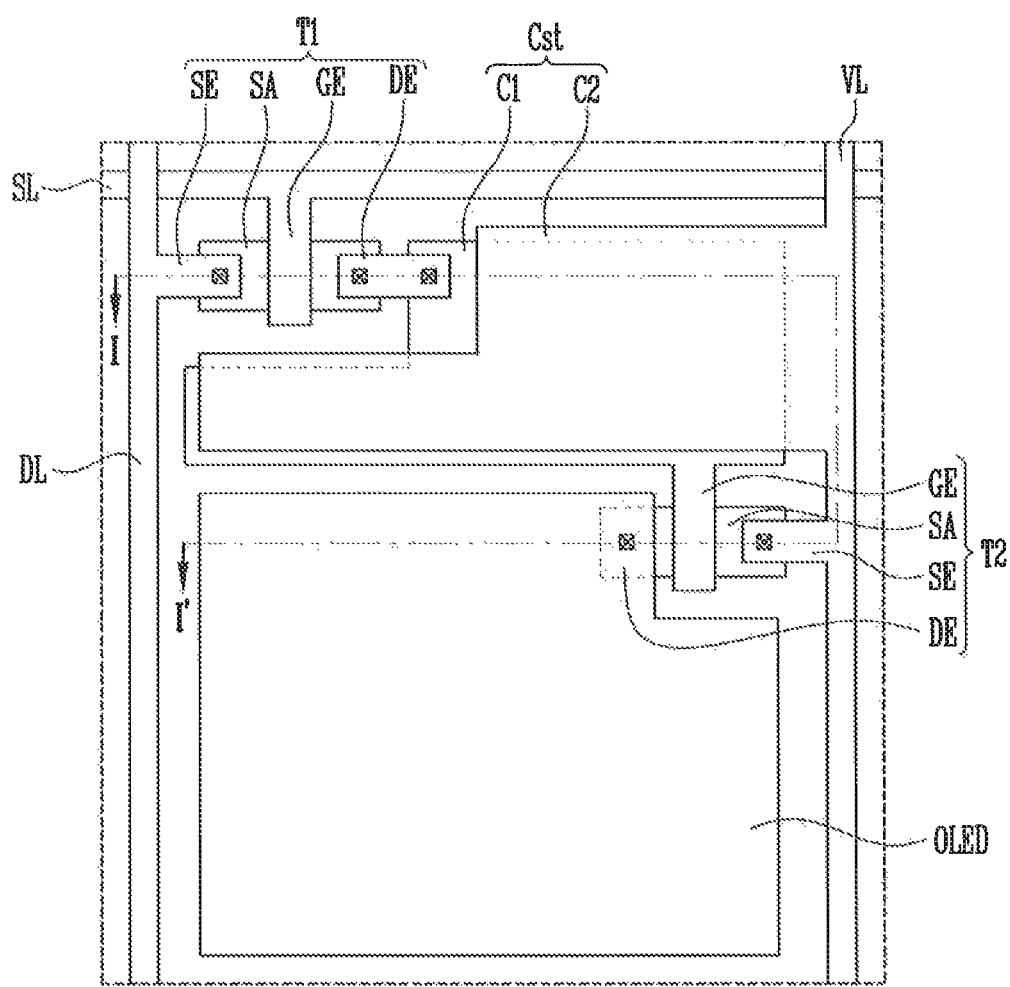
FIG. 3A is a top plan view illustrating a pixel of FIG. 1 according to an exemplary embodiment of the present invention.

FIG. 3A is a top plan view illustrating a pixel of FIG. 1 according to an exemplary embodiment of the present invention. FIG. 3B is a cross-sectional view taken along a line I-I' of FIG. 3A according to an exemplary embodiment of the present invention. FIG. 4 is a cross-sectional view illustrating a display device including three pixels according to an exemplary embodiment of the present invention.

Referring to FIGS. 1, 3A, 3B, and 4, the display panel may include an array substrate ASB, an organic light-emitting diode OLED an encapsulation member CPL, and an anti-reflection layer ARL. The organic light-emitting diode OLED may be disposed on the array substrate ASB. The encapsulation member CPL may be disposed on the light-emitting diode OLED.

The array substrate ASB may include a substrate SUB, a thin film transistor on the substrate SUB, and a capacitor.

The substrate SUB may include a transparent insulating material, for example, to allow light to pass through. The substrate SUB may include glass, quartz, a polymer organic, or the like. The polymer organic material may include one of polyethersulfone (PES), polyacrylate, polyetherimide (PEI), polyethyelenen naphthalate (PEN), polyethylene terephthalate (PET), polyphenylene sulfide (PPS), polyarylate (PAR), polyimide (PI), Polycarbonate (PC), Triacetate Cellulose (TAC), or cellulose acetate propionate (CAP). Further, the substrate SUB may also include Fiber glass Reinforced Plastic (FRP). The base substrates including glass will be described as an exemplary embodiment of the present invention in more detail below.

The number of thin film transistors provided may be at least two. The thin film transistors may each include a first thin film transistor T1 and a second thin film transistor T2. The first thin film transistor T1 may be a switching element. The first thin film transistor T1 may be connected to a scan line SL and a data line DL. The second thin film transistor T2 may be a driving element. Accordingly, the second thin film transistor T2 may be connected to a capacitor Cst and a power supply line VL.

Each of the first thin film transistor T1 and the second thin film transistor T2 may include a semiconductor layer SA, a gate electrode GE, and a source electrode SE and a drain electrode DE. The gate electrode GE may be insulating from the semiconductor layer SA. The source electrode SE and the drain electrode DE may be connected to the semiconductor layer SA.

The semiconductor layer SA may be disposed on the substrate SUB. The semiconductor layer SA may include any one of an amorphous silicon (a-Si), polycrystalline silicon (p-Si), an oxide semiconductor, or an organic semiconductor. The oxide semiconductor may include at least one among Zn, In, Ga, Sn, or a mixture thereof. For example, the oxide semiconductor may include an indium-gallium-zinc oxide (IGZO).

In the semiconductor layer SA, regions connected with the source electrode SE and the drain electrode DE may be a source region and a drain region, respectively, in which impurities are doped or injected. Further, a region between the source region and the drain region may be a channel region.

When the semiconductor layer SL includes an oxide semiconductor, a light blocking layer for blocking light incident into the oxide semiconductor layer SA may be disposed on upper and lower portions of the oxide semiconductor layer SA.

A buffer layer BUL may be disposed between the substrate SUB and the semiconductor layer SA. The buffer layer BUL may include at least one of a silicon oxide (SiOx) and a silicon nitride (SiNx). For example, the buffer layer BUL may include a first layer and a second layer. The first layer may include a silicon oxide. The second layer may be disposed on the first layer. The second layer may include a silicon nitride. Further, the buffer layer BUL may also include a silicon oxynitride (SiON). The buffer layer BUL may prevent impurities from being diffused and permeating into the semiconductor layer SA of each of the first thin film transistor T1 and the second thin film transistor T2. Thus, the buffer layer BUL may prevent an electrical characteristic of the first thin film transistor T1 and the second thin film transistor T2 from being degraded.

Further, the buffer layer BUL may prevent moisture and oxygen from permeating to the organic light-emitting diode OLED from the outside. Further, the buffer layer BUL may also substantially planarize a surface of the substrate SUB.

A gate insulating layer GI covering the semiconductor layer SA may be disposed on the substrate SUB and the semiconductor layer SA. The gate insulating layer GI may insulate the semiconductor layer SA and the gate electrode GE. The gate insulating layer GI may include at least one of a silicon oxide and a silicon nitride.

The scan line SL, the gate electrode GE, and a first capacitor electrode C1 of the capacitor Cst may be disposed on the gate insulating layer GI. The scan line SL may extend in a predetermined direction.

An interlayer insulating layer ILD may be disposed on the gate insulating layer GI, the scan line SL, the gate electrode GE, and the first capacitor electrode C1. The interlayer insulating layer ILD may cover the gate electrode GE. The interlayer insulating layer ILD may include at least one of a silicon oxide and a silicon nitride similar to the gate insulating layer GI. Further, a part of the interlayer insulating layer ILD may be removed, for example, to expose the source region and the drain region of the semiconductor layer SA.

A data line DL, a power supply line VL, a second capacitor electrode C2 of the capacitor Cst, the source electrode SE, and the drain electrode DE may be disposed on the interlayer insulating layer ILD. The data line DL may be insulated from and cross the scan line SL. The power supply line VL may be spaced apart from the data line DL.

The source electrode SE and the drain electrode DE may be insulated from the gate electrode GE by the interlayer insulating layer ILD. Further, the source electrode SE and the drain electrode DE may be connected to the source region and the drain region, respectively.

The capacitor Cst may include the first capacitor electrode C1 and the second capacitor electrode C2. The first capacitor electrode C1 may include substantially the same material as a material of the scan line SL and the gate electrode GE. The first capacitor electrode C1 may be disposed on substantially the same layer as the scan line SL and the gate electrode GE.

The second capacitor electrode C2 may include substantially the same material as a material of the data line DL, the power supply line VL, the source electrode SE, and the drain electrode DE. The second capacitor electrode C2 may be disposed on substantially the same layer as the data line DL, the power supply line VL, the source electrode SE, and the drain electrode DE.

A passivation layer PSV may be disposed on the substrate SUB. The first thin film transistor, the second thin film transistor, and the capacitor Cst may be disposed on the passivation layer PSV. The passivation layer PSV may cover the first thin film transistor, the second thin film transistor, and the capacitor Cst. Further, the passivation layer PSV may expose a part of the drain electrode DE of the second thin film transistor.

The second thin film transistor and the first thin film transistor may be thin film transistors having a top gate-type structure; however, exemplary embodiments of the present invention are not limited thereto. For example, at least one of the second and first thin film transistors may be a thin film transistor having a bottom gate-type structure. Two thin film transistors and one capacitor may be provided; however, exemplary embodiments of the present invention are not limited thereto. Varying thin film transistors and capacitors may be provided according to an exemplary embodiment of the present invention.

The passivation layer PSV may include at least one layer. For example, the passivation layer PSV may include at least one of an inorganic passivation layer and an organic passivation layer. For example, the passivation layer PSV may include an organic passivation layer covering the first thin film transistor, the second thin film transistor, and the capacitor Cst. The passivation layer PSV may also include an organic passivation layer disposed on the inorganic passivation layer.

The inorganic passivation layer may include at least one of a silicon oxide and a silicon nitride. The organic passivation layer may include an organic insulating material, for example, to allow light to pass through. For example, the organic passivation layer may include at least one of acryl-based resin (polyacrylate resin), epoxy-based resin, phenol-based resin, polyamide-based resin, polyimide-based resin, unsaturated polyester-based resin, polyphenylene ether-based resin, poly phenylenesulfide-based resin, or benzocyclobutene (BCB).

The organic light-emitting diode may be connected to the thin film transistor. The organic light-emitting diode may be connected to the drain electrode DE of the second thin film transistor T2. The organic light-emitting diode may be disposed on the passivation layer PSV.

The organic light-emitting diode OLED may include a first electrode EL1, an organic emitting layer, and a second electrode EL2. The first electrode EL1 may be connected to the drain electrode DE of the second thin film transistor T2. The organic emitting layer OL may be disposed on the first electrode EL1. The second electrode EL2 may be disposed on the organic emitting layer OL.

One of the first electrode EL1 and the second electrode EL2 may be an anode electrode and the other may be a cathode electrode. For example, the first electrode EL1 may be an anode electrode, and the second electrode EL2 may be a cathode electrode. Further, at least one of the first electrode EL1 and the second electrode EL2 may be a transmissive electrode. For example, when the organic light-emitting diode OLED is a bottom emission type organic light-emitting diode, the first electrode EL1 may be a transmissive electrode, and the second electrode EL2 may be a reflective electrode. When the organic light-emitting diode OLED is a top emission type organic light-emitting diode, the first electrode EL1 may be a reflective electrode, and the second electrode EL2 may be a transmissive electrode. When the organic light-emitting diode OLED is a dual type organic light-emitting diode, both the first electrode EL1 and the second electrode EL2 may be transmissive electrodes. According to an exemplary embodiment of the present invention, when the first electrode EL1 is an anode electrode and the organic light-emitting diode OLED is a top emission type will be described in more detail below.

The first electrode EL1 may be disposed on the passivation layer PSV. The first electrode EL1 may include a reflective layer and a transparent conductive layer. The reflective layer may reflect light. The transparent conductive layer may be disposed in an upper portion or a lower portion of the reflective layer. At least one of the reflective layer and the transparent conductive layer may be connected with the drain electrode DE of the second thin film transistor T2.

The reflective layer may include a material, which may reflect light. For example, the reflective layer may include at least one of aluminum (Al), silver (Ag), chrome (Cr), molybdenum (Mo), platinum (Pt), nickel (Ni), or an alloy thereof.

The transparent conductive layer may include a transparent conductive oxide. For example, the transparent conductive layer may include at least one transparent conductive oxide among an indium tin oxide (ITO), an indium zinc oxide (IZO), an aluminum zinc oxide (AZO), a gallium doped zinc oxide (GZO), a zinc tin oxide (ZTO), a Gallium tin oxide (GTO), or a fluorine doped tin oxide (FTO).

A pixel defining layer PDL may be disposed on the first electrode E1 and the passivation layer PL. The pixel defining layer PDL may expose a part of the first electrode EL1. For example, the pixel defining layer PDL may have a shape covering an edge of the first electrode EL1 and the passivation layer PSV.

The pixel defining layer PDL may include an organic insulating material. For example, the pixel defining layer PDL may include at least one of polystyrene, polymethylmetaacrylate (PMMA), polyacrylonitrile (PAN), polyamide (PA), polyimide (PI), polyarylether (PAE), heterocyclic polymer, parylene, epoxy resin, benzocyclobutene (BCB) based resin, siloxane based resin, or silane based resin.

The organic emitting layer OL may have a multi-layer thin film structure including at least an emitting layer. For example, the organic emitting layer OL may include a hole injection layer, a hole transport layer, an emitting layer, an electron transport layer, and an electron injection layer. The hole injection layer may inject holes. The hole transport layer may have a relatively high hole transporting characteristic, suppress a movement of electrons not combined in the emitting layer, and increase recombination between the holes and the electrodes. The emitting layer may emit light, for example, by the recombination of the injected electrons and holes. The electrode transport layer may transport the electrons to the emitting layer. The hole injection layer, the hole transport layer, the electron transport layer, and the electron injection layer may be extended to adjacent pixel areas. A color of light generated in the emitting layer may be any one of red, green, blue, and white; however, exemplary embodiments of the present invention are not limited thereto. For example, a color of light generated in the emitting layer of the organic emitting layer OL may be any one of magenta, cyan, and yellow.

A second electrode EL2 may be disposed on the organic emitting layer OL. The second electrode EL2 may be a semi-transmissive reflective layer. For example, the second electrode EL2 may be a relatively thin metal layer having a thickness, with which light may be allowed to pass through. The second electrode EL2 may allow a portion of light generated in the organic emitting layer OL to pass through, and reflect the remaining part of the light generated in the organic emitting layer OL. The light reflected from the second electrode EL2 may be reflected from the reflection layer of the first electrode EL1 and pass through the second electrode EL2, for example, by constructive interference.

The second electrode EL2 may be provided with a semi-transmissive reflective layer in an area corresponding to the organic emitting layer OL. The second electrode EL2 may be provided with a reflective layer in other areas. For example, a part of the second electrode EL2 provided on the organic emitting layer OL may be provided with a semi-transmissive reflective layer. The second electrode EL2 provided on the pixel defining layer PDL may be provided with a reflective layer. The reflective layer on the pixel defining layer PDL reflects light emitted from the adjacent organic emitting layer OL. Accordingly, the light emitted from the adjacent organic emitting layers OL from being mixed and moving toward a user may be prevented. The second electrode EL2 may have different thicknesses in the area corresponding to the organic emitting layer OL and other areas. The second electrode EL2 may have different thicknesses, thereby having different reflection profiles. The second electrode EL2 disposed on the pixel defining layer PDL may be thicker than the second electrode EL2 disposed on the organic emitting layer OL. Thus, the second electrode EL2 may prevent the light emitted from the adjacent organic emitting layers OL from being mixed and moving toward a user.

The second electrode EL2 may include a material having a relatively lower work function than a work function of the transparent conductive layer of the first electrode EL1. For example, the second electrode E2 may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), nickel (Ni), calcium (Ca), or an alloy thereof.

The encapsulation layer CPL may be disposed on the second electrode EL2. The encapsulation layer CPL may isolate the organic light-emitting diode OLED from an external environment. For example, the encapsulation layer CPL may prevent external moisture and oxygen from permeating into the organic light-emitting diode OLED.

The encapsulation layer CPL may be a thin film encapsulation layer. The thin film encapsulation layer may include a plurality of inorganic layers and a plurality of organic emitting layers. The plurality of inorganic layers and the plurality of organic emitting layers may be disposed on the anti-reflection layer ARL. For example, the encapsulation layer CPL may have a structure, in which inorganic layers and organic emitting layers are alternately laminated. Further, the topmost layer of the encapsulation layer CPL may be an inorganic layer.

The inorganic layer may include at least one of a silicon oxide (SiOx), a silicon nitride (SiNx), a silicon oxynitride (SiON), an aluminum oxide ($Al_2O_3$), a titanium oxide ($TiO_2$), a zirconium oxide (ZrOx), or a tin oxide (ZnO).

The anti-reflection layer ARL may be disposed on the encapsulation layer CPL. The anti-reflection layer ARL may prevent light from the outside from being reflected. Thus, the anti-reflection layer ARL may prevent light from the outside from being recognized by the user.

A structure of the anti-reflection layer ARL may prevent light from the outside from being reflected, and thus, the structure is not limited. The anti-reflection layer ARL may include a color filter CF and a black matrix BM. The color filter CF and the black matrix BM may be provided in each pixel.

A cover layer CVL covering the color filter CF and the black matrix BM is provided on the color filter CF and the black matrix BM.

The organic light-emitting diode within each pixel may emit any one of red light, green light, and blue light, so that the color filter CF may be provided with a color corresponding to each pixel on the organic light-emitting diode. For example, a red color filter CF_R may be provided on the organic light0emitting diode emitting red light, a green color filter CF_G may be provided on the organic light-emitting diode emitting green light, and a blue color filter CF_B may be provided on the organic light-emitting diode emitting blue light.

The black matrix BM may be provided between adjacent color filters CF.

The color filter CF and the black matrix BM may be configured to serve as anti-reflection layers, which absorb or allow only light of a specific wavelength to pass through to prevent light from the outside from being reflected. Further, the color filter CF and the black matrix BM may allow light of a specific wavelength to pass through, for example, to increase color purity of emitted light.

Each pixel emits any one of red light, green light, and blue light; however, exemplary embodiments of the present invention are not limited thereto. Each pixel may emit light of other colors. The color filter CF may also be changed in response to light emitted from the organic light-emitting diode. For example, when the organic light-emitting diode emits light of a magenta color, a magenta color filter may be provided on the organic light-emitting diode. When the organic light-emitting diode emits white light, a red color filter, a green color filter, and a blue color filter may be provided on as the color filters.

The display device may prevent external light from being reflected and prevent ultraviolet rays from the outside from moving to the organic light-emitting diode by using the anti-reflection layer at substantially the same time. In the display device according to an comparative example, a polarizing plate may be provided between the display device and a window substrate for preventing external light from being reflected and blocking ultraviolet rays. According to an exemplary embodiment of the present invention, the display device may prevent the degradation of an image quality and a device defect due to external light even though a separate polarizing plate is not provided. In addition, the polarizing plate has a predetermined thickness. Therefore, when the polarizing plate is provided in the display device, an entire thickness of the display device may be increased. According to an exemplary embodiment of the present invention, the polarizing plate may be omitted. Thus, a relatively thin display device may be provided.

The ultraviolet blocking layer of the window substrate may be provided between the first and second glass substrates. Thus, the window substrate may have an impact resistance property. Accordingly, a bending deformation by point impact and surface impact and compressive strain and/or tensile strain by surface impact may be relieved.

The bending deformation by the point impact may be confirmed through a pen drop impact resistance test using a specific pen. According to an exemplary embodiment of the present invention, impact resistance against point impact may be determined by a method of examining whether the window substrate is damaged by free-falling a specific pen (Fine BiC pan of Societe Bic Company) of about 5.8 g on a surface of the window substrate in a vertical state along a height in a state where the specific pen is covered with a cap. The window substrate according to an exemplary embodiment of the present invention may have impact resistance of at least about 7 cm. Accordingly, when the pen of about 5.8 g is fallen toward the window substrate at a height of about 7 cm or less, the window substrate might not be broken.

Figure 5A:
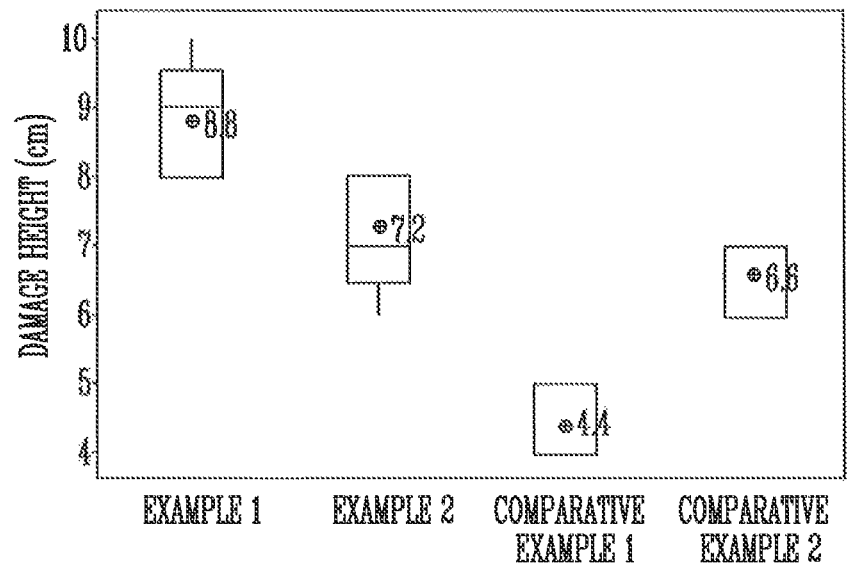
FIG. 5A is a graph illustrating impact resistance characteristics of window substrates according to a comparative example and window substrates according to an exemplary embodiment of the present invention.

FIG. 5A is a graph illustrating impact resistance characteristics of a window substrate according to a comparative example, and the window substrates according to an exemplary embodiment of the present invention.

In FIG. 5A, Comparative Examples 1 and 2 represent impact resistance characteristics of the window substrates according to comparative examples. Examples 1 and 2 represent impact resistance characteristics of the window substrates according to the exemplary embodiments of the present invention. In FIG. 4, each window substrate was bonded onto a base film by using an adhesive, and other conditions, except for each window substrate, were equally maintained. As the base film, a polyethylene terephthalate film having a thickness of about 50 μm was used.

In FIG. 5A, in Comparative Example 1, a single-layer window substrate having a thickness of about 80 μm was used. In Comparative Example 2, a single-layer window substrate having a thickness of about 100 μm was used. In Example 1, the window substrate, in which the ultraviolet blocking layer having a thickness of about 20 μm is formed between the first and second glass substrates having a thickness of about 50 μm each, was used. In Example 2, the window substrate, in which the ultraviolet blocking layer having a thickness of about 20 μm is formed between the first and second glass substrates having a thickness of about 40 μm each, was used.

Referring to FIG. 5A, in Examples 1 and 2, the window substrates are damaged at a height of about 7 cm or more. In Comparative Examples 1 and 2, the window substrates are damaged at a height of about 7 cm or less. The impact resistance characteristic of the window substrate according to an exemplary embodiment of the present invention may be increased.

The window substrate used in the display device according to the exemplary embodiment of the present invention may have a relatively low repulsive force (e.g., bending stiffness) when the window substrate is transformed. The window substrate may be folded several times when being applied to the display device and the like, and repulsive force when a user folds the window substrate may have the degree, for example, in which the user does not feel inconvenience. The window substrate according to an exemplary embodiment of the present invention may have repulsive force of about 20 N or less, or about 10 N or less.

The repulsive force may be measured by a two point bending test method. Bending strength may be confirmed through the two point bending test. The two point bending test may be performed by a method of preparing a lower zig and an upper zig. The lower zig and the upper zig may be substantially parallel to each other. A specimen having a predetermined size (e.g., about 7.2 inches) may be disposed between the lower zig and the upper zig in a bent state. A power applied to the upper zig may be specified. In this case, the specimen may be bent so that both ends thereof face each other. One end of both ends may be in contact with the upper zig. The other end of the specimen may be in contact with the lower zig.

Figure 5B:
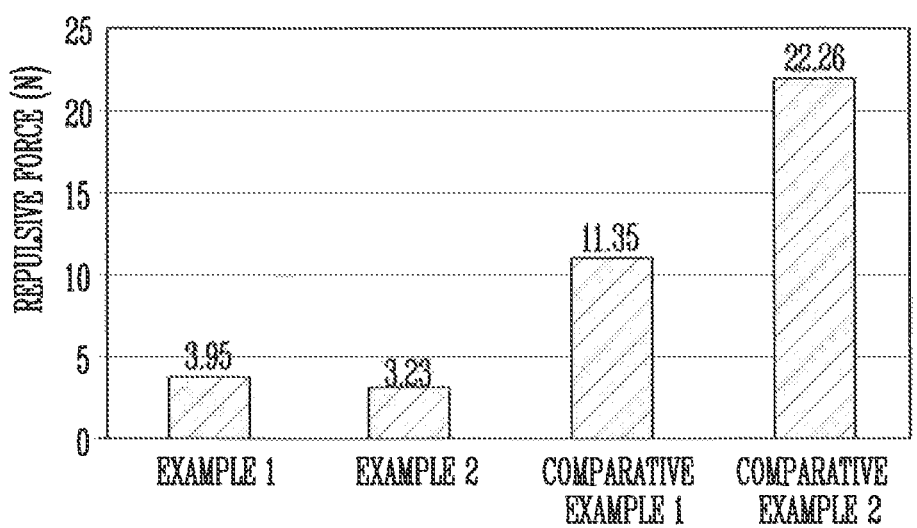
FIG. 5B is a graph illustrating repulsive force of window substrates according to a comparative example and window substrates according to an exemplary embodiment of the present invention.

FIG. 5B is a graph illustrating repulsive force of the window substrates according to a comparative example, and the window substrates according to an exemplary embodiment of the present invention.

In FIG. 5B, the conditions of Comparative Examples 1 and 2, and Examples 1 and 2 are substantially the same as those of FIG. 4.

Referring to FIG. 5B, repulsive force in Examples 1 and 2 has a value of about 4 N or less. Repulsive force in Comparative Example 1 has a value of about 11 N. Repulsive force in Comparative Example 2 has a value of about 22 N. Accordingly, in an exemplary embodiment of the present invention, the window substrate may have repulsive force in the degree for the user to use the window substrate.

In the display device according to an exemplary embodiment of the present invention, the window substrate may exhibit an increased ultraviolet blocking effect. Example 1 represented transmissivity of about 0.02% in a wavelength band of about 400 nm or less. Example 2 represented transmissivity of about 0.01% in a wavelength band of about 400 nm or less. According to an exemplary embodiment of the present invention, the ultraviolet blocking effect may be increased when the window substrate omits a separate polarizing plate.

If the anti-reflection layer prevents light from the outside from being reflected, a structure of the anti-reflection layer is not particularly limited. Thus, the anti-reflection layer may be implemented in other forms.

Figure 6:
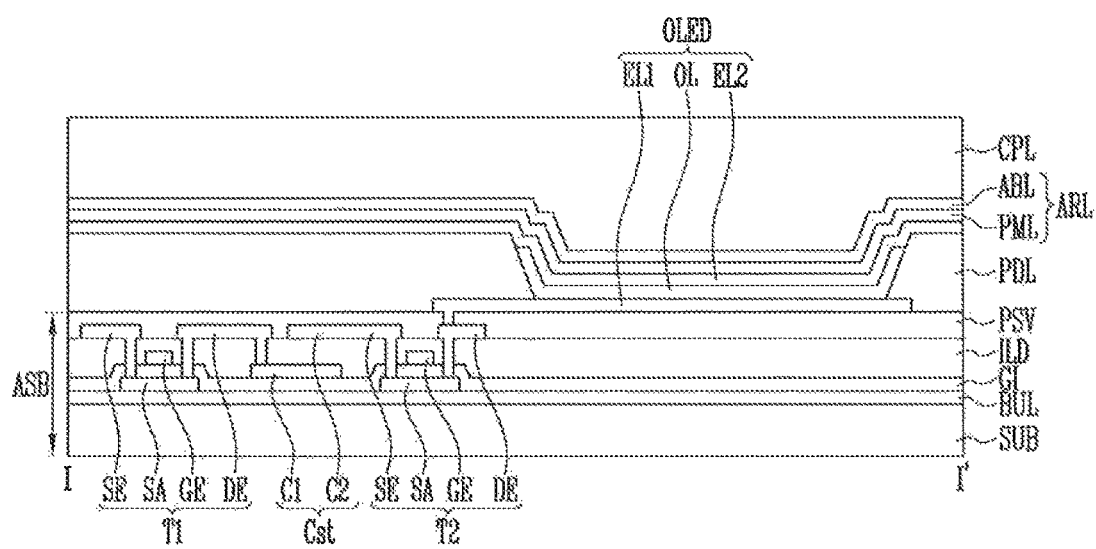
FIG. 6 is a cross-sectional view taken along a line I-I' of FIG. 3A according to an exemplary embodiment of the present invention.

FIG. 6 is a cross-sectional view taken along a line I-I' of FIG. 3A according to an exemplary embodiment of the present invention.

An anti-reflection layer ARL may be disposed between a second electrode EL2 and an encapsulation layer CPL.

The anti-reflection layer ARL may include one or more phase matching layers PML and a light absorbing layer ABL. The one or more phase matching layers PML may be disposed on the second electrode. The light absorbing layer ABL may be disposed on the phase matching layer PML.

The phase matching layer PML may be provided with a thickness, in which light reflected from the second electrode EL2 and light reflected from a reflection layer RML of the first electrode EL1 may cause destructive interference. For example, light reflected from the second electrode EL2 and light reflected from the reflection layer RML of the first electrode EL1 may have a phase different satisfying a destructive interference condition by the phase matching layer PML. Accordingly, the phase matching layer PML of each pixel may have a different thickness according to a corresponding color.

The phase matching layer PML may be optically transparent. The term "optically transparent" may refer to the state where about 50% or more, for example, about 80% or more, of visible rays may pass through.

In a visible ray region, the phase matching layer PML may include a material, of which a refractive index is 1 or more and an extinction coefficient is 5 or less. For example, the phase matching layer PML may include at least one of an aluminum oxide (AlOx), a silicon oxide (SiOx), a calcium fluoride (CaF), a magnesium fluoride (MgF$_2$), a lithium fluoride (LiF), a silicon nitride (SiNx), a silicon carbonitride (SiCN), a silicon oxynitride (SiON), a tantalum oxide (TaxOy), or a titanium oxide (TiOx).

Further, the phase matching layer PML may include a transparent conductive oxide. For example, the phase matching layer PML may include at least one of an indium tin oxide (ITO) or an indium zinc oxide (IZO).

The phase matching layer PML may include a conductive organic material.

For example, the phase matching layer PML may include at least one of polypyrrole, polythiophene, olyacetylene, poly(3,4-ethylenedioxythiophene) polystyrene sulfonate (PEDOT:PSS), or polyaniline. When the phase matching layer PML includes a transparent conductive oxide or a conductive organic material, a voltage drop (IR-Drop) phenomenon generated in the second electrode may be prevented.

The light absorbing layer ABL may be a semi-transmissive reflection layer. Light reflected from the light absorbing layer ABL may generate destructive interference with light reflected from the second electrode or the reflection layer RML.

The light absorbing layer ABL may include a material, of which a multiplication of a refractive index and an extinction coefficient in a visible ray area is 0.5 or more, for example, 2 to 4. For example, the light absorbing layer ABL may include at least one of chrome (Cr), titanium (Ti), molybdenum (Mo), cobalt (Co), nickel (Ni), tungsten (W), aluminum (Al), silver (Ag), gold (Au), copper (Cu), iron (Fe), magnesium (Mg), platinum (Pt), manganese (Mn), or an alloy thereof. Further, the light absorbing layer ABL may also include at least one of a chrome nitride (CrNx), a titanium nitride (TiNx), a titanium aluminum nitride (TiAlNx), a molybdenum oxide (MoOx), or a copper oxide (CuOx).

The display device according to an exemplary embodiment of the present invention may further include an additional element in addition to the window substrate and the display panel.

Figure 7:
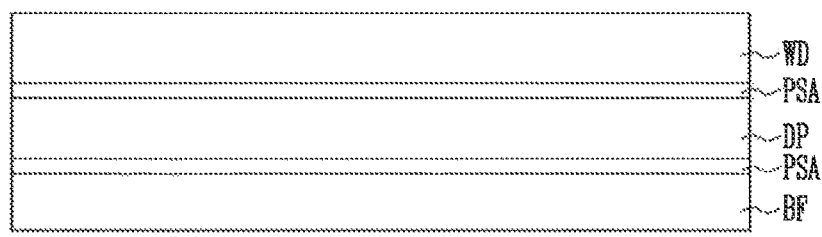
FIGS. 7 to 9 are cross-sectional views illustrating display devices according to exemplary embodiments of the present invention.
Figure 8:
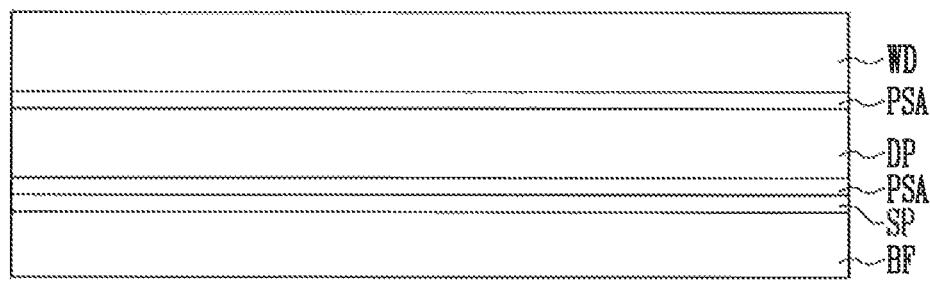
Figure 9:
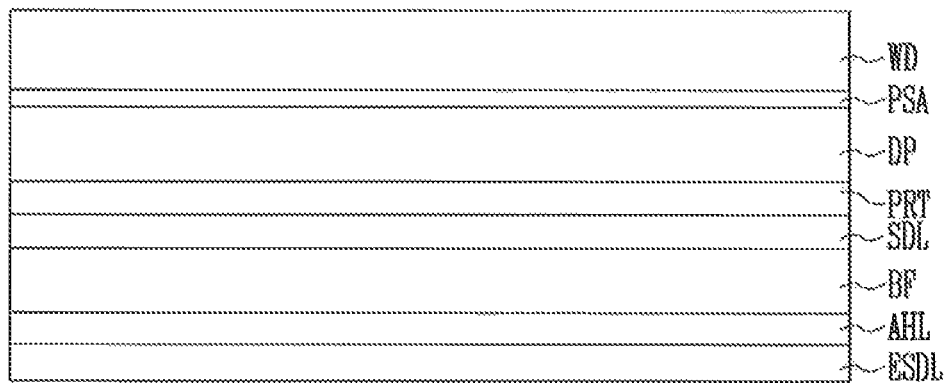

FIGS. 7 to 9 are cross-sectional views illustrating display devices according to an exemplary embodiment of the present invention.

Referring to FIG. 7, a display device according to an exemplary embodiment of the present invention may include a display panel DP, a buffer material, and a window WD. The buffer material may be disposed on a rear surface of the display panel DP. The window WD may be disposed on a front surface of the display panel DP. An adhesive PSA may be provided between the display panel DP and the buffer material BF. The adhesive PSA may also be provided between the display panel DP and the window substrate WD. However, the adhesive PSA may be omitted.

The display panel DP may have a plate shape having the front surface and the rear surface. The display panel DP may display an image, for example, through the front surface.

The buffer material BF may be provided to the rear surface of the display panel DP. The buffer material BF may protect the display panel DP from an impact. The buffer material BF may have a single layer; however, exemplary embodiments of the present invention are not limited thereto. For example, the buffer material BF may include a plurality of parts of the buffer material BF or a plurality of entire buffer materials BF is laminated.

The buffer material BF may be provided on one surface of the display panel DP. The buffer material BF may be provided on the rear surface of the display panel DP. The buffer material BF may be provided in a plate shape corresponding to the shape of the display panel DP. The buffer layer BF may cover at least a part of the rear surface of the display panel DP. For example, when the display panel DP is provided in a rectangular shape, the buffer material BF may be provided in a rectangular shape corresponding to the rectangular shape of the display panel DP. Otherwise, when the display panel DP is provided in a circular shape, the buffer material BF may also be provided in a circular shape corresponding to the circular shape of the display panel DP.

The buffer material BF may relieve an impact from the outside. Thus, the display panel DP may be prevented from being damaged or erroneously operated by the impact from the outside. The impact from the outside may refer to power from the outside expressible as pressure and stress, and means power causing a defect to the display panel DP.

The buffer material BF may have elastic force, for example, enough to absorb impact from the outside and disperse impact from the outside to a peripheral area. For example, the buffer material BF may have elastic force, by which the buffer material BF is transformed by impact from the outside, and is restorable to an original state when pressure from the outside is removed.

The buffer material BF may include thermoplastic polystyrene, polyolefin, polyurethane, polyamide, synthetic rubber, polydimethylsiloxane, polybutadiene, polyisobutylene, poly(styrene-butadienestyrene), polyurethane, polychloroprene, polyethylene, silicone, or combinations thereof; however, exemplary embodiments of the present invention are not limited thereto.

The window substrate WD may be provided on a polarizing plate POL, for example, to protect the display panel DP and block ultraviolet rays.

Referring to FIG. 8, a support member SP may be further disposed between a display panel DP and a buffer material BF.

The support member SP may be a metal film. The support member SP may prevent the display device from being bent by point impact. When a relatively solid metal film is provided to a rear surface of the display panel DP, the metal film may buffer point impact applied from the outside together with the buffer material BF. Particularly, the metal film has an excellent point impact buffering effect despite of a small thickness, so that an entire thickness of the display device is not increased. The metal film may be used so that the relatively thin buffer material BF may be used. Accordingly, the support member SP may include the metal film, thereby manufacturing a relatively thin display device.

The metal film may include at least one of, Zr, V, Nb, Ta, Cr, Mo, W, Mn, Fe, Ru, Co, Rh, Ni, Pd, Pt, Cu, Ag, Au, Zn, Cd, Al, Ga, In, or an alloy thereof. When the metal film includes the aforementioned elements, the metal film may provide an EMI shielding/heat radiating function, in addition to the buffering function. A thickness of the metal film may be about 10 μm to about 50 μm. When a thickness of the metal film is less than about 10 μm, the impact buffering effect by the metal film may not be relatively high. Further, when a thickness of the metal film is larger than about 50 μm, a thickness of the display device may be increased.

The metal film may be provided to the entire display panel DP; however, exemplary embodiments of the present invention are not limited thereto. When a foldable area is present in the display device, the metal film may be formed in an area except for the foldable area. The metal film may have a relatively low elasticity. Thus, the metal film might not be restored into an original state when the display device is folded and unfolded.

Referring to FIG. 9, a display device according to an exemplary embodiment of the present invention may include a display panel DP, a window WD, a buffer material BF, a protective film PRT, an optical shielding layer SDL, a heat radiating layer AHL, and an electromagnetic wave blocking layer ESDL. The window WD may be disposed on a front surface of the display panel DP. The buffer material BF may be disposed on a rear surface of the display panel DP. The protective film PRT may be disposed between the display panel DP and the buffer material BF. The optical shielding layer SDL may be disposed between the protective film PRT and the buffer material BF. The heat radiating layer AHL may be disposed on an external surface of the buffer material BF. The electromagnetic wave blocking layer ESDL may be disposed on an external surface of the heat radiating layer AHL. Thus, the display device may include the electromagnetic wave blocking layer ESDL, the heat radiating layer AHL, the buffer material BF, the optical shielding layer SDL, the protective film PRT, the display panel DP, and the window WD, which are sequentially laminated.

The protective film PRT may be attached to a rear surface of the display panel DP, for example, to protect the display panel DP. The protective film PRT may be bonded to the display panel DP, for example, with an adhesive provided therebetween.

The protective film PRT may include an organic polymer. The organic polymer may include at least one of, for example, polyethylene, polypropylene, an ethylene-propylene copolymer, an ethylene-vinyl acetate copolymer, an olefin based polymer, polyethylene terephthalate, polyethylene naphthalate, polybutylene terephthalate, polycarbonate, polyvinyl chloride, a vinyl acetate base polymer, polyphenylene sulfide, polyamide (nylon), polyamide, polyimide, polyetheretherketone, or polyether.

The optical shielding layer SDL may prevent light from passing from the rear surface of the display panel DP in a direction of the front surface of the display panel DP. The optical shielding layer SDL may be provided in a form of a light blocking film. The optical shielding layer SDL may have a black color.

The heat radiating layer AHL may prevent heat generated within the display device from being provided to the display panel DP. The display panel DP may be adjacently disposed to a driver similar to a printed circuit board, Thus, heat generated from the driver may be transmitted to the display panel DP. Heat may facilitate degradation of the pixel, thereby causing a defect of the pixel. The heat radiating layer AHL may serve to insulate and radiate heat generated from the driver.

The heat radiating layer AHL may include a base substrate and a metal in the base substrate. The metal may be any one or more selected from the group consisting of aluminum (Al), copper (Cu), molybdenum (Mo), silver (Ag), tungsten (Ti), or molybdenum (Mo). The base material may include an organic polymer, such as polycarbonate (PC) or polyethylene terephthalate (PET). Further, the heat radiating layer AHL may include a material having a relatively high heat conductivity. The material may also discharge heat relatively easily. The heat radiating layer AHL may be include any one or more selected from the group consisting of graphite, graphene, carbon nanotube (CNT), or metal filler.

The electromagnetic wave blocking layer ESDL may shield electromagnetic interference (EMI) generated in the driver.

The electromagnetic wave blocking layer ESDL may include a conductive sheet. The conductive sheet may include at least one of gold (Au), silver (Ag), copper (Cu), aluminum (Al), titanium (Ti), an indium tin oxide (ITO), an indium zinc oxide (IZO), carbon nanotube (CNT), or graphite.

The electromagnetic wave blocking layer ESDL may be a copper sheet.

According to an exemplary embodiment of the present invention, an adhesive may be provided between the elements. However, the position of the adhesive provided is not limited thereto.

As described above, the display device according to an exemplary embodiment of the present invention may block ultraviolet rays and may prevent external light from being reflected without a polarizing plate. Accordingly, the polarizing plate may be omitted. Thus, a relatively thin display device may be manufactured.

The display device according to an exemplary embodiment of the present invention may be included in various electronic devices. For example, the display device may be included in a television, a notebook computer, a mobile phone, a smart phone, a smart pad (PD), a Portable Multimedia Player (PDP), a Personal Digital Assistant (PDA), a navigation device, various wearable devices, such as a smart watch, or the like.

Although the present disclosure has been described with reference to the exemplary embodiments of the present invention, those skilled in the art may understand that the present disclosure may be variously modified and changed within a scope without departing from the spirit and the area of the present disclosure described in the accompanying claims.

What is claimed is:

1. A display device, comprising:
    a display panel configured to display an image through an upper surface thereof;
    a window substrate disposed on the upper surface of the display panel and including at least two sheets of base substrates;
    an ultraviolet blocking layer disposed between the at least two sheets of base substrates; and
    an optically transparent adhesive layer disposed between the display panel and the window substrate,
    wherein the ultraviolet blocking layer is interposed between two sheets among the at least two sheets of base substrates, and
    wherein the two sheets are attached by the ultraviolet blocking layer.

2. The display device of claim 1, wherein the ultraviolet blocking layer has transmissivity of about 10% or less in a wavelength band of less than about 350 nm.

3. The display device of claim 1, wherein the ultraviolet blocking layer has transmissivity of about 1% or less in a wavelength band of less than about 400 nm.

4. The display device of claim 1, wherein the at least two sheets of base substrates include a first glass substrate having a first thickness and a second glass substrate having a second thickness, and each of the first thickness and the second thickness is about 20 μm to about 100 μm.

5. The display device of claim 4, wherein when the window substrate is bent so that the first glass substrate is disposed at an external side of the display device and the second glass substrate is disposed at an internal side of the display device, and wherein the first thickness is smaller than the second thickness.

6. The display device of claim 4, wherein a thickness of the ultraviolet blocking layer is about 10 μm to about 100 μm.

7. The display device of claim 1, wherein the ultraviolet blocking layer includes an optically transparent adhesive.

8. The display device of claim 1, wherein the number of base substrates is at least three.

9. The display device of claim 1, wherein the display panel includes:
    an array substrate;
    an organic light-emitting diode disposed on the array substrate; and
    an anti-reflection layer disposed on the organic light-emitting diode.

10. The display device of claim 9, wherein the anti-reflection layer includes a color filter and a black matrix.

11. The display device of claim 9, wherein the organic light-emitting diode includes:
    a first electrode disposed on the array substrate;
    an organic emitting layer disposed on the first electrode; and
    a second electrode disposed on the organic emitting layer.

12. The display device of claim 11, wherein the second electrode includes a semi-transmissive reflective layer in an area corresponding to the organic emitting layer, and includes a reflective layer in other areas.

13. The display device of claim 12, wherein the second electrode has different thicknesses in the area corresponding to the organic emitting layer and the other areas.

14. The display device of claim 1, wherein at least one of the at least two sheets of base substrates is chemically tempered.

15. The display device of claim 1, wherein the window substrate has an impact resistance characteristic such that the window substrate is not damaged when a pen of about 5.8 g is vertically fallen onto one surface of the window substrate at a first height, and the first height is about 7 cm or more.

16. The display device of claim 1, wherein at least a part of the window substrate and the display panel is flexible.

17. The display device of claim 1, further comprising:
a buffer layer disposed on a rear surface of the display panel, and the buffer layer is configured to absorb impact applied to the window substrate and the display panel.

18. The display device of claim 17, further comprising:
a support member disposed between the display panel and the buffer layer.

19. The display device of claim 18, wherein the support member includes a metal.

20. A display device, comprising:
a display panel configured to display an image through an upper surface thereof;
a window substrate disposed on the upper surface of the display panel and including at least two sheets of base substrates; and
an ultraviolet blocking layer disposed between the at least two sheets of base substrates,
wherein the ultraviolet blocking layer attaches adjacent two sheets of the at least two sheets of base substrates to each other, is elastic, and comprises a material blocking ultraviolet rays and a material bonding the adjacent two sheets of base substrates.

* * * * *